United States Patent
Park

(10) Patent No.: US 9,881,736 B2
(45) Date of Patent: Jan. 30, 2018

(54) MULTILAYER CERAMIC COMPONENT

(71) Applicant: SAMSUNG ELECTRO-MECHANICS CO., LTD., Suwon-Si, Gyeonggi-Do (KR)

(72) Inventor: Heung Kil Park, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 45 days.

(21) Appl. No.: 14/941,513

(22) Filed: Nov. 13, 2015

(65) Prior Publication Data

US 2016/0211075 A1 Jul. 21, 2016

(30) Foreign Application Priority Data

Jan. 20, 2015 (KR) ........................ 10-2015-0009323

(51) Int. Cl.
| | |
|---|---|
| H01G 4/228 | (2006.01) |
| H01G 4/30 | (2006.01) |
| H01G 4/005 | (2006.01) |
| H01G 4/06 | (2006.01) |
| H01G 2/06 | (2006.01) |
| H01G 4/38 | (2006.01) |
| H01G 4/224 | (2006.01) |
| H05K 1/02 | (2006.01) |
| H05K 1/18 | (2006.01) |
| H01G 2/02 | (2006.01) |
| H01G 4/232 | (2006.01) |

(52) U.S. Cl.
CPC .............. *H01G 2/065* (2013.01); *H01G 2/02* (2013.01); *H01G 4/224* (2013.01); *H01G 4/232* (2013.01); *H01G 4/38* (2013.01); *H05K 1/0271* (2013.01); *H05K 1/181* (2013.01); *H05K 2201/10015* (2013.01); *H05K 2201/10545* (2013.01); *Y02P 70/611* (2015.11); *Y02T 10/7022* (2013.01)

(58) Field of Classification Search
CPC .......... H01G 4/30; H01G 4/248; H01G 4/224; H01G 2/065; H01G 4/38
USPC ............. 361/303, 321.1, 301.4, 321.2, 306.1
See application file for complete search history.

(56) References Cited

U.S. PATENT DOCUMENTS

| | | | |
|---|---|---|---|
| 2002/0034059 A1* | 3/2002 | Kijima ................. | H05K 1/0231 361/301.5 |
| 2004/0066589 A1 | 4/2004 | Togashi et al. | |
| 2008/0019081 A1* | 1/2008 | Kim ........................ | H01G 2/06 361/535 |
| 2009/0147448 A1 | 6/2009 | Matsuoka et al. | |

(Continued)

FOREIGN PATENT DOCUMENTS

| | | |
|---|---|---|
| JP | 2004-022562 A | 1/2004 |
| JP | 2004-134430 A | 4/2004 |

(Continued)

*Primary Examiner* — Eric Thomas
*Assistant Examiner* — Arun Ramaswamy
(74) *Attorney, Agent, or Firm* — McDermott Will & Emery LLP

(57) ABSTRACT

A multilayer ceramic component includes multilayer ceramic capacitors disposed on opposing surfaces of a board in a thickness direction of the board and metal terminals connected to electrode pads disposed on the board. The metal terminals are partially exposed to an exterior of the multilayer ceramic component.

11 Claims, 10 Drawing Sheets

(56) References Cited

U.S. PATENT DOCUMENTS

| | | | | |
|---|---|---|---|---|
| 2010/0123995 A1* | 5/2010 | Otsuka | ............... | H01G 2/06 361/308.1 |
| 2011/0007452 A1* | 1/2011 | Lin | ............... | H01G 2/06 361/541 |
| 2011/0216475 A1* | 9/2011 | Chiu | ............... | H01G 9/00 361/434 |

FOREIGN PATENT DOCUMENTS

| | | |
|---|---|---|
| JP | 2009-283490 A | 12/2009 |
| JP | 2012-156568 A | 8/2012 |

\* cited by examiner

MULTILAYER CERAMIC COMPONENT

CROSS-REFERENCE TO RELATED APPLICATION

This application claims the benefit of priority to Korean Patent Application No. 10-2015-0009323, filed on Jan. 20, 2015 with the Korean Intellectual Property Office, the entirety of which is incorporated herein by reference.

BACKGROUND

The present disclosure relates to a multilayer ceramic component.

A multilayer ceramic capacitor (MLCC), a multilayer electronic component, is a chip-type condenser mounted on the circuit boards of a range of electronic products including display devices such as liquid crystal displays (LCDs), plasma display panels (PDPs), and the like, computers, personal digital assistants (PDAs), mobile phones, and other devices, serving to allow electricity to be charged therein or discharged therefrom.

Multilayer ceramic capacitors (MLCC) may be used as components in various types of electronic apparatuses, due to advantages thereof such as a small size, high capacitance, and ease of mountability.

As electronic vehicle control schemes have been developed, amounts of electrical control units (ECU) mounted in vehicles have significantly increased. Such ECUs may be used in environments in which changes in temperature are relatively large and vibrations and impacts are applied thereto for long periods of time.

Therefore, in multilayer ceramic components used in industrial/electrical fields, such as ECUs, high degrees of durability and high levels of reliability through resistance to heat stress and mechanical stress have been required.

According to the related art, as a method allowing for high degrees of reliability to be provided to multilayer ceramic components, a metal frame has been used. However, in a case of using such a metal frame, since a significantly difficult method of adhering the metal frame to the multilayer ceramic capacitor should be used, the manufacturing costs of a product may be rapidly increased.

SUMMARY

An aspect of the present disclosure may provide a multilayer ceramic component having high durability and high reliability against heat stress and mechanical stress and preventing piezoelectric vibrations of a multilayer ceramic capacitor from being transferred to a board.

According to an aspect of the present disclosure, a multilayer ceramic component comprises multilayer ceramic capacitors disposed on opposing surfaces of a board in a thickness direction of the board; and metal terminals connected to electrode pads disposed on the board, wherein the metal terminals are partially exposed to an exterior of the multilayer ceramic component.

The electrode pads may be connected to each other by a via electrode.

The exposed portions of the metal terminals may extend to partially cover a surface of a molding part in a thickness direction of the molding part.

The multilayer ceramic capacitors may comprise external electrodes disposed on opposing end portions of the multilayer ceramic capacitors.

The multilayer ceramic capacitors and the electrode pads may be bonded to each other by conductive adhesive layers.

According to another aspect of the present disclosure, a multilayer ceramic component comprises a board including a plurality of electrode pads disposed to be spaced apart from each other in a length direction on opposing surfaces of the board in a thickness direction of the board; a plurality of first and second multilayer ceramic capacitors disposed on both surfaces of the board in the thickness direction such that external electrodes thereof are connected to electrode pads adjacent to the external electrodes, respectively; a molding part enclosing the board and the plurality of first and second multilayer ceramic capacitors; and first and second metal terminals having first ends connected to the electrode pads disposed to be spaced apart from each other on the board in the length direction, respectively, and second ends exposed to an exterior of the multilayer ceramic component.

The electrode pads disposed to face each other with the board interposed between the electrode pads may be electrically connected to each other by a via electrode penetrating through the board.

The first and second metal terminals may include: first and second bonding portions having first ends connected to the electrode pads disposed to be spaced apart from each other on the board in the length direction, respectively, and second ends exposed to opposing surfaces of the molding part in a length direction of the molding part, respectively; first and second terminal portions disposed to be spaced apart from each other on a surface of the molding part in a thickness direction of the molding part; and first and second connection portions disposed on opposing surfaces of the molding part in the length direction, respectively, and connecting the first and second bonding portions to the first and second terminal portions, respectively.

The first and second connection portions may have at least one groove.

At least one of the electrode pads may extend to be exposed to an end surface of the board in the length direction.

The multilayer ceramic component may further comprise plating layers formed on the electrode pads.

The multilayer ceramic capacitors may include first and second external electrodes disposed on opposing end portions of a ceramic body in a length direction, respectively, the first and second external electrodes including first and second connection portions disposed on opposing surfaces of the ceramic body in the length direction, respectively, and first and second band portions extended from the first and second connection portions to portions of at least one surface of the ceramic body in a thickness direction.

The multilayer ceramic capacitor may include a plurality of first and second internal electrodes alternately stacked in the ceramic body with respective dielectric layers interposed between the plurality of first and second internal electrodes to be alternately exposed to opposing surfaces of the ceramic body in the length direction, and connected to the first and second connection portions, respectively.

The multilayer ceramic component may further comprise conductive adhesive layers disposed between the electrode pads and the first and second band portions, respectively.

The conductive adhesive layers may be disposed between the electrode pads and the first and second metal terminals, respectively.

BRIEF DESCRIPTION OF DRAWINGS

The above and other aspects, features and other advantages of the present disclosure will be more clearly understood from the following detailed description taken in conjunction with the accompanying drawings.

DETAILED DESCRIPTION

Figure 1:
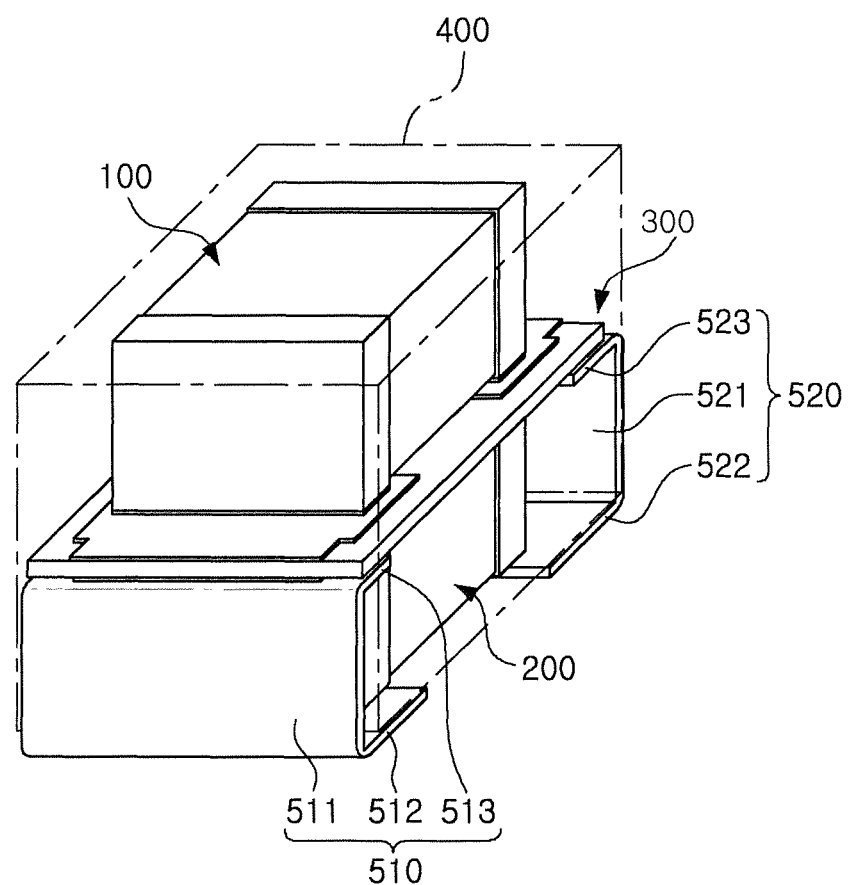
FIG. 1 is a perspective view schematically illustrating a multilayer ceramic component according to an exemplary embodiment in the present disclosure.

Hereinafter, embodiments of the present disclosure will be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 7:
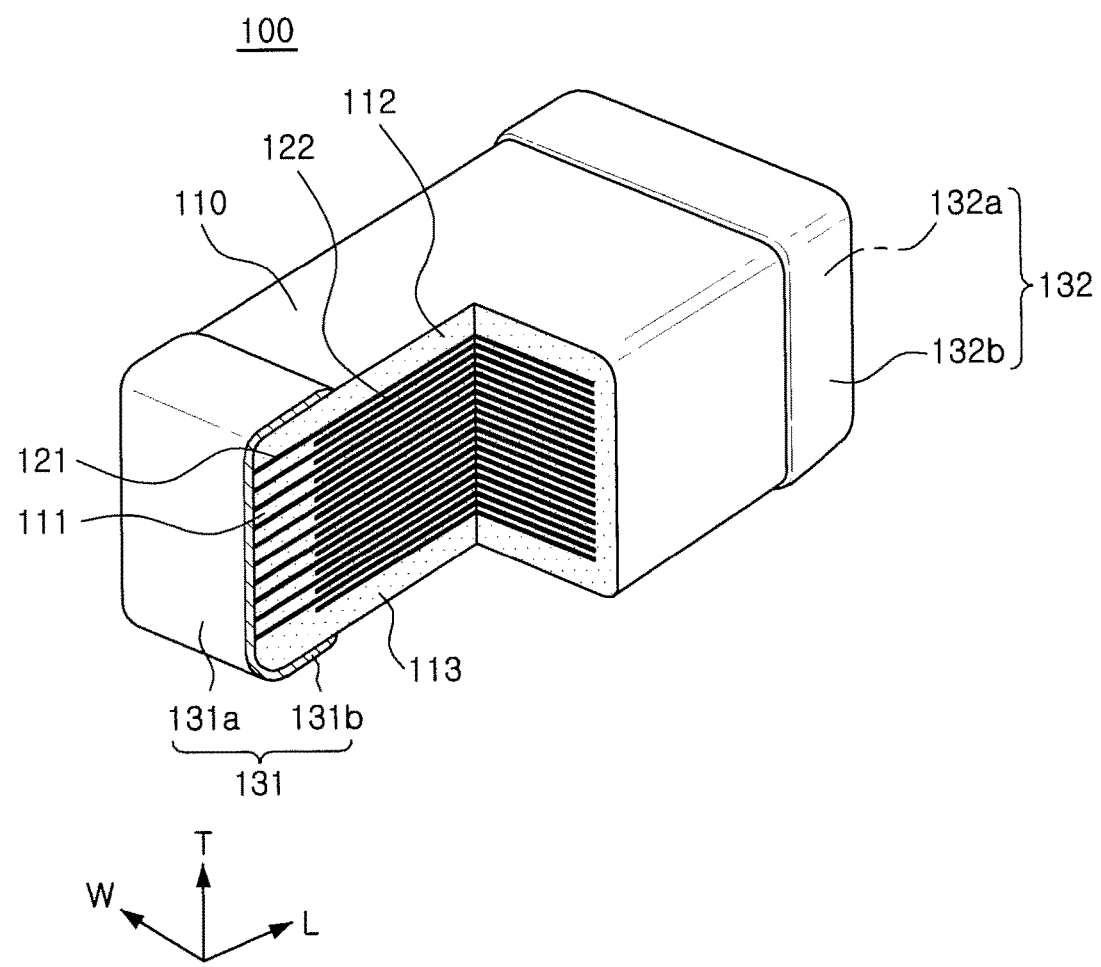
FIG. 7 is a partially cut-away perspective view illustrating a multilayer ceramic capacitor used in the multilayer ceramic component according to the exemplary embodiment in the present disclosure.

Directions will be defined in order to clearly describe the embodiments of the present disclosure. L, W and T directions as illustrated in FIG. 7 refer to a length direction, a width direction, and a thickness direction, respectively. Here, the thickness direction may be the same as a stacking direction in which dielectric layers are stacked.

Further, in the present exemplary embodiment, for convenience of explanation, surfaces of a ceramic body opposing each other in a thickness direction are defined as main surfaces or upper and lower surfaces, while the lower surface is defined as a mounting surface.

Multilayer Ceramic Component

A multilayer ceramic component according to an exemplary embodiment in the present disclosure may include: multilayer ceramic capacitors connected to both surfaces of a board; and metal terminals connected to electrode pads of the board, wherein the multilayer ceramic capacitors and the board are molded so that the metal terminals are partially exposed.

In this case, the electrode pads disposed on both surfaces of the board may be electrically connected to each other by a via electrode.

Further, exposed portions of the metal terminals may be extended onto portions of one main surface of a molding part.

Figure 2:
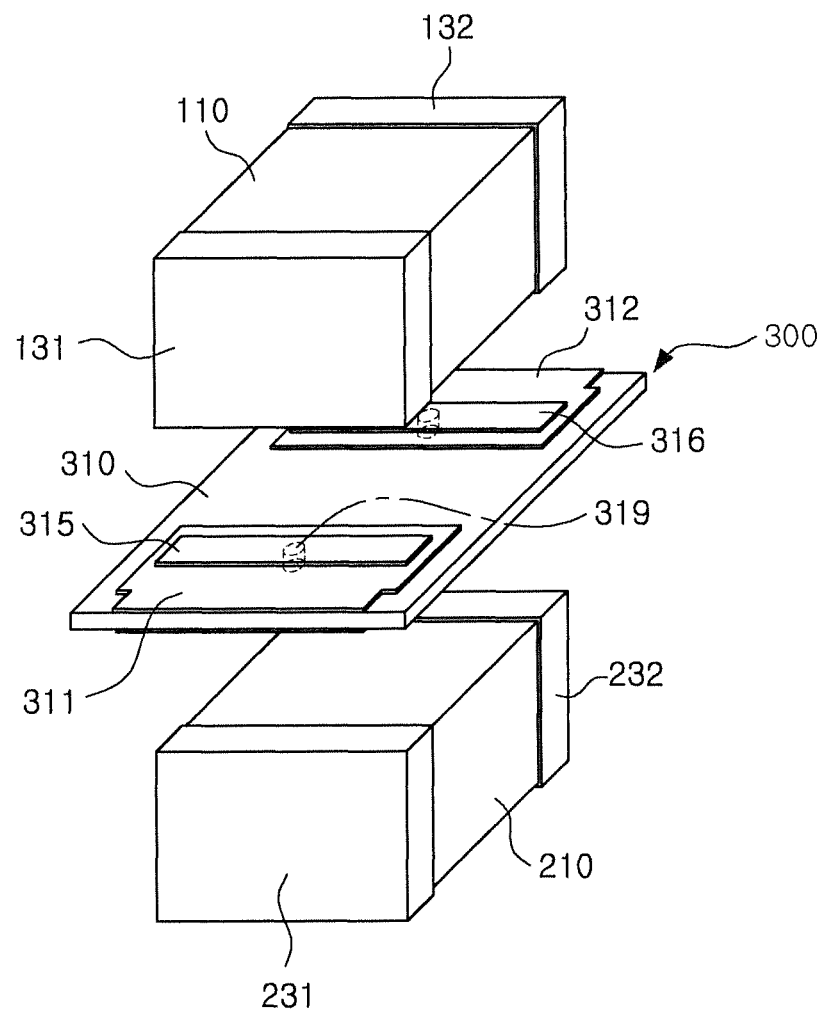
FIG. 2 is an exploded perspective view of the multilayer ceramic component of FIG. 1 from which a molding part and a terminal frame are removed.
Figure 3:
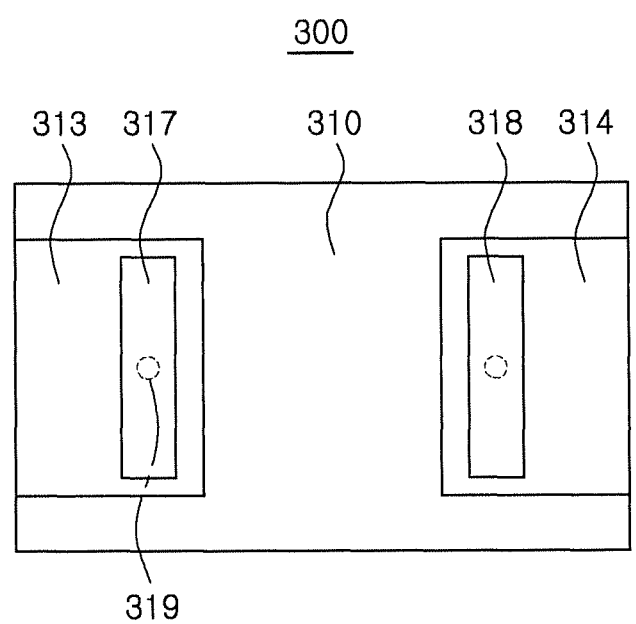
FIG. 3 is a bottom view of a board of FIG. 2.
Figure 4:
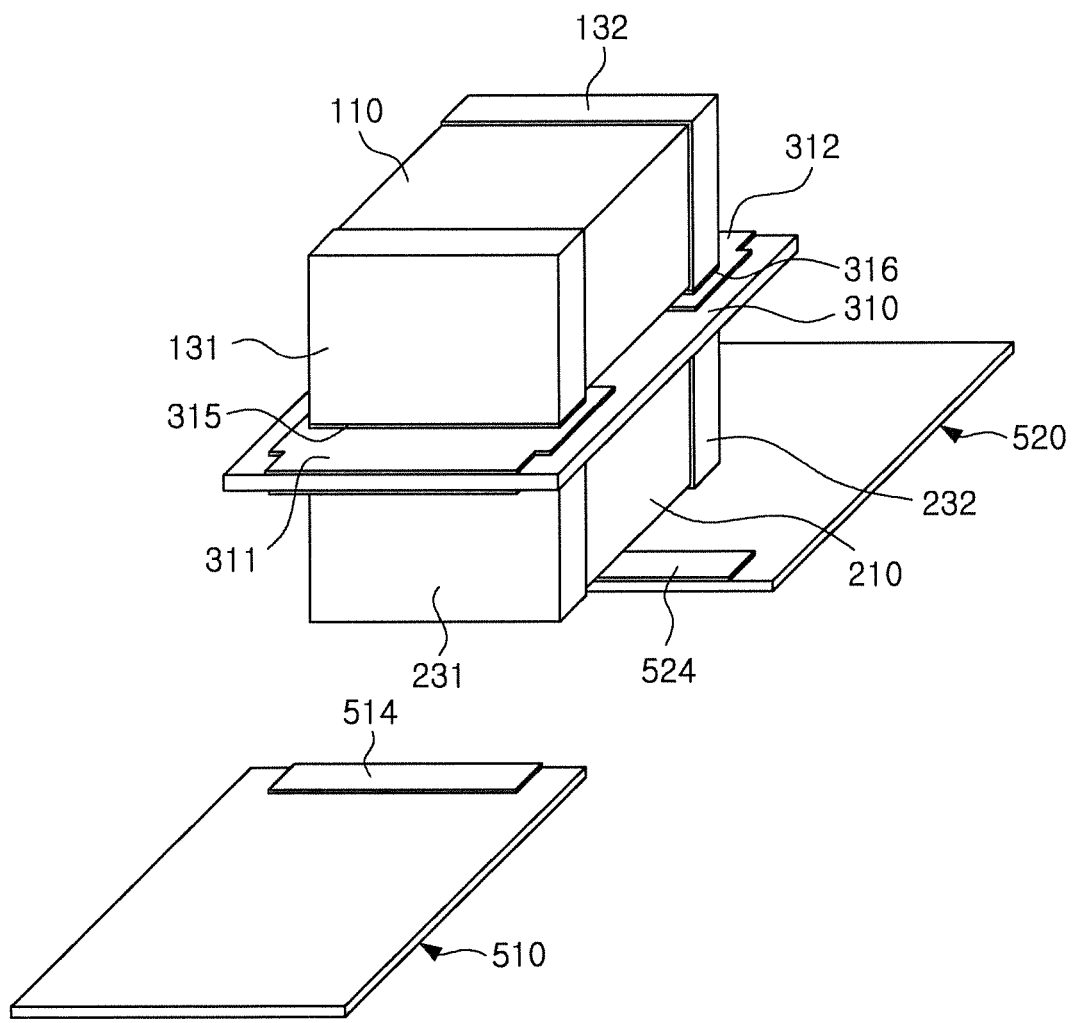
FIG. 4 is an exploded perspective view schematically illustrating a coupling structure of the board and the terminal frame in the multilayer ceramic component according to the exemplary embodiment in the present disclosure.
Figure 5:
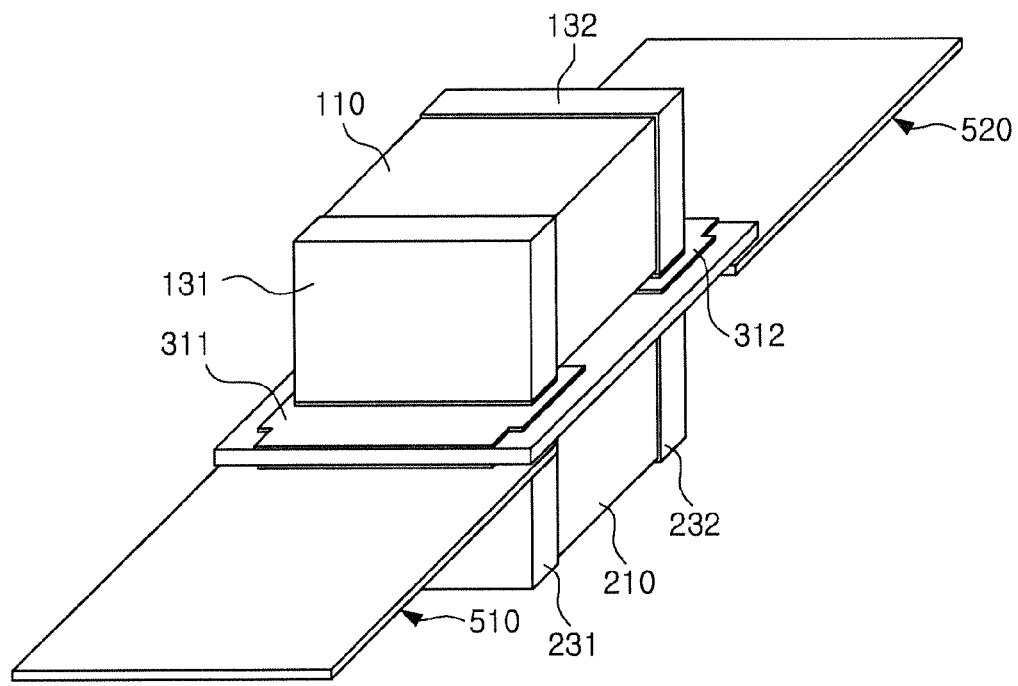
FIG. 5 is a perspective view schematically illustrating the coupling structure of the board and the terminal frame in the multilayer ceramic component according to the exemplary embodiment in the present disclosure.
Figure 6:
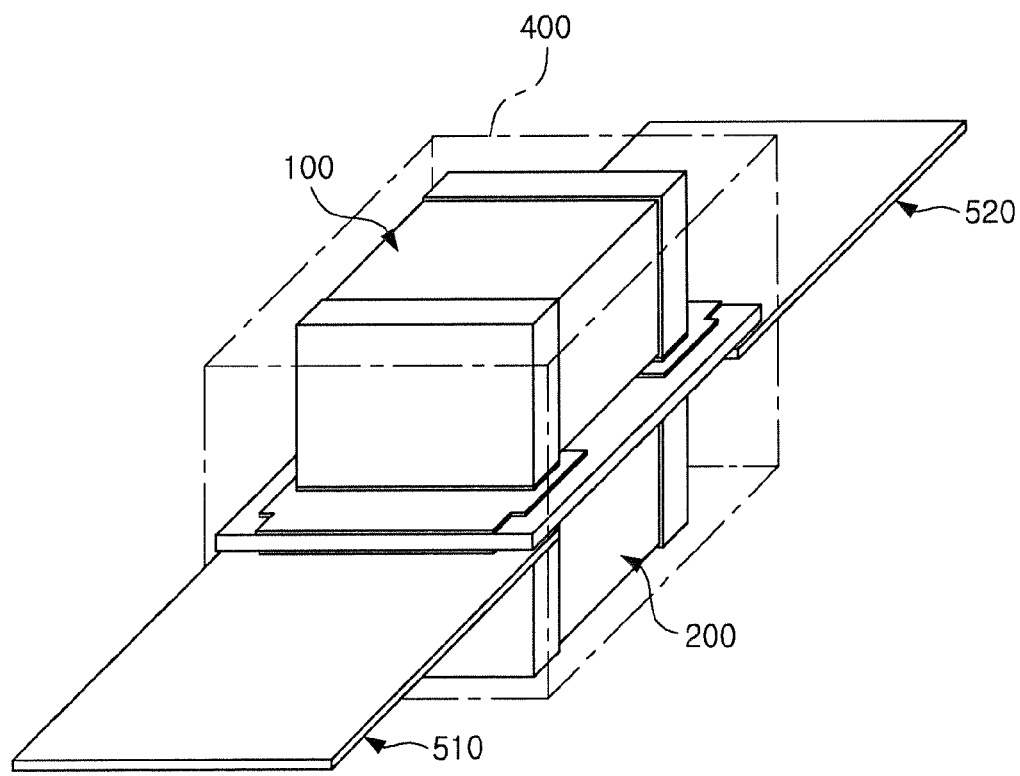
FIG. 6 is a perspective view illustrating the molding part formed to enclose the multilayer ceramic capacitor and the board in FIG. 5.

FIG. 1 is a perspective view schematically illustrating a multilayer ceramic component according to an exemplary embodiment in the present disclosure. FIG. 2 is an exploded perspective view of the multilayer ceramic component in FIG. 1 from which a molding part and a terminal frame are removed. FIG. 3 is a bottom view of a board in FIG. 2. FIG. 4 is an exploded perspective view schematically illustrating a coupling structure of the board and the terminal frame in the multilayer ceramic component according to an exemplary embodiment in the present disclosure. FIG. 5 is a perspective view schematically illustrating the coupling structure of the board and the terminal frame in the multilayer ceramic component according to an exemplary embodiment in the present disclosure. FIG. 6 is a perspective view illustrating the molding part formed to enclose the multilayer ceramic capacitor and the board in FIG. 5.

Referring to FIGS. 1 through 6, the multilayer ceramic component according to the exemplary embodiment in the present disclosure may include a board 300; first and second multilayer ceramic capacitors 100 and 200; a molding part 400; and first and second metal terminals 510 and 520.

In this case, the board 300 and the first and second multilayer ceramic capacitors 100 and 200 may be smaller than the molding part 400.

The board 300 according to the present exemplary embodiment may include a body 310, a pair of first electrode pads 311 and 312 disposed on an upper surface of the body 310, and a pair of second electrode pads 313 and 314 disposed on a lower surface of the body 310.

The body 310, having a hexahedral shape formed to be elongated in the length direction, may be formed of an insulating material, for example, an epoxy resin, a phenol resin, a polyimide resin, or the like. However, a material of the body 310 is not limited thereto.

The first electrode pads 311 and 312 may be disposed to be spaced apart from each other on the upper surface of the body 310 in the length direction, and may come into mechanical contact with lower surfaces of first and second band portions of first and second external electrodes 131 and 132 of a first multilayer ceramic capacitor 100 to be described below, thereby being electrically connected to the first multilayer ceramic capacitor 100.

The first electrode pads 311 and 312 as described above may be formed on the upper surface of the body 310 by sputtering, for example.

In this case, first conductive adhesive layers 315 and 316 may be disposed on upper surfaces of the first electrode pads 311 and 312, respectively, such that the first electrode pads 311 and 312 and lower surfaces of first and second band portions of first and second external electrodes 131 and 132 of a first multilayer ceramic capacitor 100 to be described below may adhere to each other, and adhesive force therebetween may be improved.

The first conductive adhesive layers 315 and 316 may be formed of, for example, high temperature solder or a conductive adhesive formed of silver (Ag) paste, or the like.

However, a material of the first conductive adhesive layers 315 and 316 is not limited thereto.

The second electrode pads 313 and 314 may be disposed to be spaced apart from each other on the lower surface of the body 310 in the length direction, and disposed to correspond to the first electrode pads 311 and 312 with the body 310 interposed therebetween.

The second electrode pads 313 and 314 may come into mechanical contact with upper surfaces of first and second band portions of first and second external electrodes 231 and 232 of a second multilayer ceramic capacitor 200 to be described below, thereby being electrically connected to the second multilayer ceramic capacitor 200.

The second electrode pads 313 and 314 as described above may be formed, for example, on the lower surface of the body 310 using a sputtering method.

In this case, second conductive adhesive layers 317 and 318 may be disposed on lower surfaces of the second electrode pads 313 and 314, respectively, such that the second electrode pads 313 and 314 and upper surfaces of first and second band portions of first and second external electrodes 231 and 232 of a second multilayer ceramic capacitor 200 to be described below may adhere to each other, and adhesive force therebetween may be improved.

The second conductive adhesive layers 317 and 318 may be formed of, for example, high temperature solder or a conductive adhesive formed of silver (Ag) paste, or the like. However, a material of the second conductive adhesive layers 317 and 318 is not limited thereto.

Meanwhile, a via electrode 319 may be formed to penetrate through the body 310 in positions in which the first electrode pads 311 and 312 and the second electrode pads 313 and 314 face each other, such that the first electrode pads 311 and 312 and the second electrode pads 313 and 314 may be electrically connected to each other.

Further, the first electrode pads 311 and 312 and the second electrode pads 313 and 314 may extend outwardly in the length direction so that spaces for bonding the first and second metal terminals 510 and 520 may be sufficiently secured. If necessary, the first electrode pads 311 and 312 and the second electrode pads 313 and 314 may extend to be exposed to both end surfaces of the body 310 in the length direction.

Further, plating layers may be formed on surfaces of the first electrode pads 311 and 312 and the second electrode pads 313 and 314.

The plating layers may be formed of nickel (Ni), tin (Sn), gold (Au), copper (Cu), or the like. However, the plating layers are not limited thereto.

FIG. 7 is a partially cut-away perspective view illustrating the multilayer ceramic capacitor used in the multilayer ceramic component according to an exemplary embodiment in the present disclosure.

Hereinafter, since a configuration of the second multilayer ceramic capacitor 200 is the same as that of the first multilayer ceramic capacitor 100, a detailed description thereof will be omitted, and only the first multilayer ceramic capacitor 100 will be described below.

Referring to FIG. 7, the first multilayer ceramic capacitor 100 according to the present exemplary embodiment may include a ceramic body 110, first and second internal electrodes 121 and 122, and first and second external electrodes 131 and 132.

The ceramic body 110 may be formed by stacking a plurality of dielectric layers 111 and sintering the stacked dielectric layers 111. In this case, a shape and dimensions of the ceramic body 110 and the number of stacked dielectric layers 111 may be variously changed and are not limited to those of the present exemplary embodiment illustrated in FIG. 7.

In addition, the plurality of dielectric layers 111 configuring the ceramic body 110 may be in a sintered state, and adjacent dielectric layers 111 may be integrated with each other so that boundaries therebetween are not readily apparent without the use of a scanning electron microscope (SEM).

In addition, the ceramic body 110 may include an active layer as a portion thereof contributing to forming capacitance within the capacitor and upper and lower cover layers 112 and 113 disposed on and below the active layer as upper and lower margin parts, respectively.

The active layer may be formed by repeatedly stacking the plurality of first and second internal electrodes 121 and 122, having the dielectric layer 111 interposed therebetween.

In this case, a thickness of the dielectric layer 111 may be suitably changed, according to a capacitance design of the first multilayer ceramic capacitor 100.

Further, the dielectric layer 111 may contain ceramic powder having high permittivity, for example, barium titanate ($BaTiO_3$) -based powder or strontium titanate ($SrTiO_3$) -based powder. However, a material of the dielectric layer 111 is not limited thereto.

The upper and lower cover layers 112 and 113 may have the same material and configuration as those of the dielectric layer 111 of the active layer, except that internal electrodes are not included therein.

Further, the upper and lower cover layers 112 and 113 may be formed by stacking one or two or more dielectric layers on and below the active layer in the thickness direction, respectively, and may generally serve to prevent the first and second internal electrodes 121 and 122 from being damaged by physical or chemical stress.

The first and second internal electrodes 121 and 122, electrodes having different polarities, may be formed by printing a conductive paste containing a conductive metal on the dielectric layers 111 to a predetermined thickness.

In this case, the conductive metal contained in the conductive paste may be, for example, nickel (Ni), copper (Cu) palladium (Pd) or alloys thereof. However, the conductive metal is not limited thereto.

Further, as a printing method of the conductive paste, for example, a screen printing method, a gravure printing method, or the like, may be used. However, the printing method is not limited thereto.

The first and second internal electrodes 121 and 122 may be alternately stacked in the ceramic body 110 to face each other in the stacking direction of the dielectric layers 111.

The first and second internal electrodes 121 and 122 may be disposed to be alternately exposed to both end surfaces of the ceramic body 110 in the length direction, with each of the dielectric layers 111 interposed therebetween.

In this case, the first and second internal electrodes 121 and 122 may be electrically insulated from each other by the dielectric layer 111 disposed therebetween.

Further, portions of the first and second internal electrodes 121 and 122 alternately exposed to both end surfaces of the ceramic body 110 in the length direction may come into mechanical contact with first and second connection portions of first and second external electrodes 131 and 132 to be described below, respectively, such the first and second internal electrodes 121 and 122 may be electrically connected to the first and second external electrodes 131 and 132, respectively.

Therefore, when a voltage is applied to the first and second external electrodes 131 and 132, electric charges may be accumulated between the first and second internal electrodes 121 and 122 facing each other.

In this case, capacitance of the first multilayer ceramic capacitor 100 may be proportional to an area of an overlapping region between the first and second internal electrodes 121 and 122 in the active layer.

Further, a thickness of the first and second internal electrodes 121 and 122 as described above may be determined according to the use thereof.

The first and second external electrodes 131 and 132 may be formed of a conductive paste containing a conductive metal.

Here, the conductive metal may be, for example, nickel (Ni), copper (Cu), palladium (Pd), gold (Au) or alloys thereof. However, the conductive metal is not limited thereto.

The first and second external electrodes 131 and 132 as described above may include first and second connection portions 131*a* and 132*a* and first and second band portions 131*a* and 132*b*.

In the first and second external electrodes 131 and 132, the first and second connection portions 131*a* and 132*a* may be portions disposed on both end surfaces of the ceramic body 110 in the length direction, respectively, and the first and second band portions 131*b* and 132*b* may be portions extended from the first and second connection portions 131*a* and 132*a* to portions of the lower surface, the mounting surface of the ceramic body 110, respectively.

In this case, the first and second band portions 131*b* and 132*b* may be bonded to the first electrode pads 311 and 312 of the board 300 by the first conductive adhesive layers 315 and 316 to thereby be electrically connected to the board 300.

Here, the first and second band portions 131*b* and 132*b* may be further extended onto at least one of the upper surface of the ceramic body 110, both end surfaces thereof in the length direction, and both side surfaces thereof in the width direction.

Although a case in which the first and second band portions 131*b* and 132*b* of the first and second external electrodes 131 and 132 are extended from the first and second connection portions 131*a* and 132*a* to all portions of the upper surface of the ceramic body 110, both end surfaces thereof in the length direction, and both side surfaces thereof in the width direction to cover both end portions of the ceramic body 110 is described and illustrated in the present exemplary embodiment, the first and second band portions 131*b* and 132*b* are not limited thereto.

Further, since the first and second external electrodes 131 and 132 contain insulating resin layers containing conductive metal particles, the insulating resin layers as described above, formed by applying, for example, an insulating epoxy, or the like, may absorb mechanical stress from the outside, or the like, thereby serving to prevent damage such as cracks, or the like, from being generated in the ceramic body 110 and the first and second internal electrodes 121 and 122.

According to the present exemplary embodiment, since the capacitors are mounted on upper and lower surfaces of the board 300 to face each other, the component may be miniaturized, and capacitance may be improved.

The molding part 400 may be formed by injection-molding a material such as an epoxy molding compound (EMC) and formed to enclose the board 300 and the first and second multilayer ceramic capacitors 100 and 200.

The molding part 400 as described above may prevent moisture and water from infiltrating into the first and second multilayer ceramic capacitors 100 and 200 and it may also improve adhesive strength between the first and second multilayer ceramic capacitors 100 and 200 and the board 300.

First ends of the first and second metal terminals 510 and 520 may be connected to the second electrode pads 313 and 314 of the board 300, and second ends thereof may be exposed externally from the molding part 400 to thereby be connected to external terminals (not illustrated).

The first and second metal terminals 510 and 520 may include first and second bonding portions 513 and 523 having first ends connected to the second electrode pads 313 and 314 disposed to be spaced apart from each other on one surface of the board 300, respectively, and second ends exposed to both end surfaces of the molding part 400 in the length direction, respectively; first and second terminal portions 512 and 522 disposed to be spaced apart from each other on one main surface of the molding part 400; and first and second connection portions 511 and 521 disposed on both end surfaces of the molding part 400 in the length direction, respectively, and connecting exposed portions of the first and second bonding portions 513 and 523 to first ends of the first and second terminal portions 512 and 522.

In this case, the first and second bonding portions 513 and 523, the first and second connection portions 511 and 521, and the first and second terminal portions 512 and 522 may respectively be formed by bending a single metal plate along an outer surface of the molding part 400 twice.

The first and second metal terminals 510 and 520 as described above may absorb mechanical stress from the outside, thereby preventing the first and second multilayer ceramic capacitors 100 and 200 from being damaged.

Further, since heat generated in the first or second multilayer ceramic capacitor 100 or 200 by a ripple current may be radiated through the first and second metal terminals 510 and 520, a temperature increase in the first or second multilayer ceramic capacitor 100 or 200 may be suppressed, and reliability may be improved.

Further, adhesive layers 514 and 524 may be further disposed on the first and second bonding portions 513 and 523 of the first and second metal terminals 510 and 520 to improve adhesive strength with the second electrode pads 313 and 314.

Meanwhile, a case in which the first and second metal terminals 510 and 520 are connected to the second electrode pads 313 and 314 disposed on the lower surface of the body 310 of the board 300 and extended onto the lower surface of the molding part 400 is illustrated and described in the present exemplary embodiment.

However, if necessary, the first and second metal terminals 510 and 520 may be connected to the first electrode pads 311 and 312 disposed on the upper surface of the body 310 of the board 300 and extended onto the upper surface of the molding part 400. That is, the first and second metal terminals 510 and 520 are not limited thereto.

Modified Exemplary Embodiment

Figure 8:
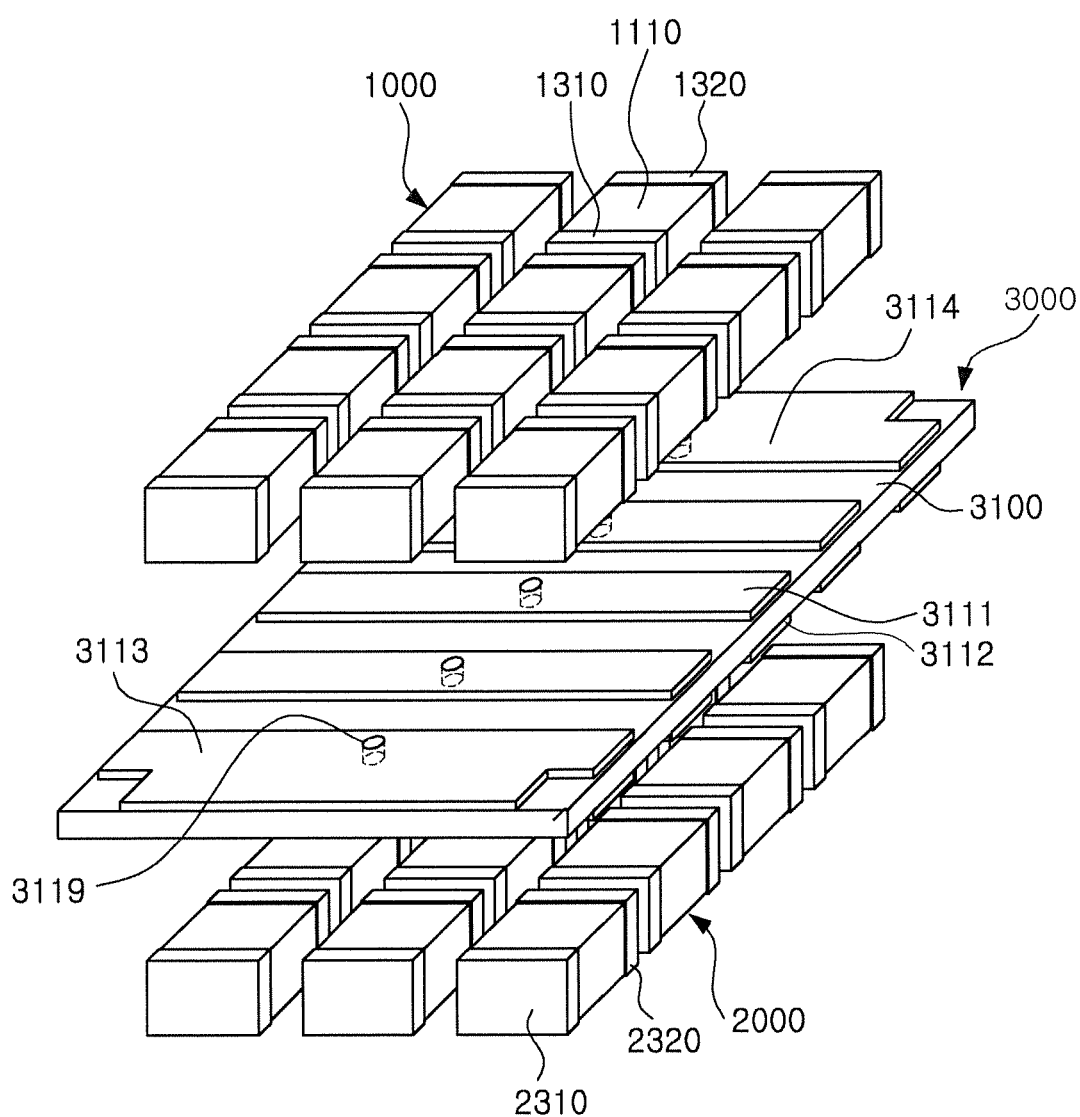
FIG. 8 is an exploded perspective view schematically illustrating a disposition of a board and a plurality of multilayer ceramic capacitors in a multilayer ceramic component according to another exemplary embodiment in the present disclosure.
Figure 9:
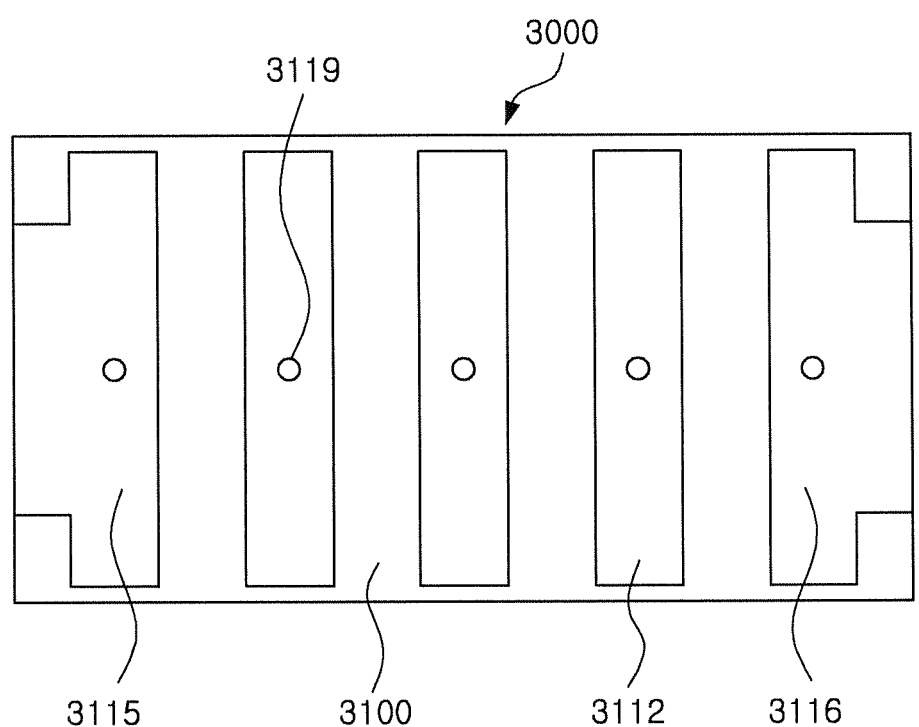
FIG. 9 is a bottom view of the board in FIG. 8.
Figure 10:
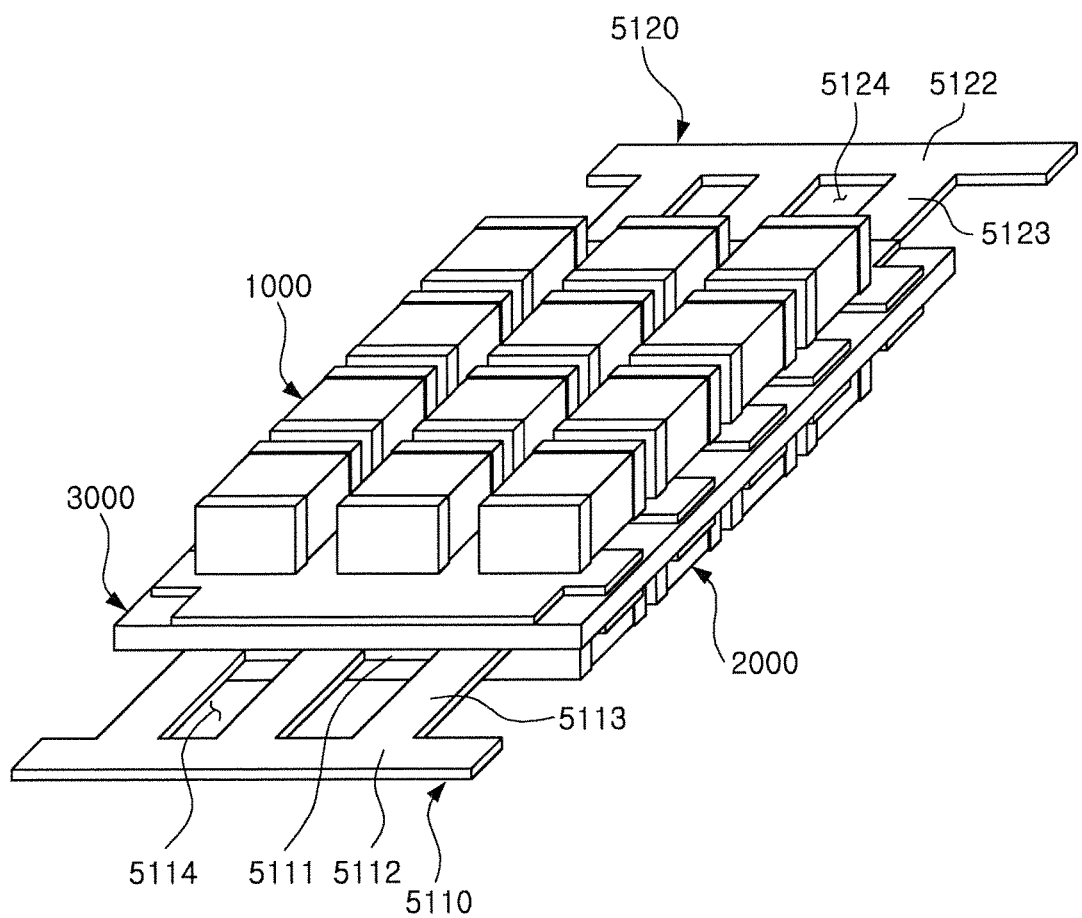
FIG. 10 is a perspective view schematically illustrating the coupling structure of the board and a terminal frame in the multilayer ceramic component according to another exemplary embodiment in the present disclosure.
Figure 11:
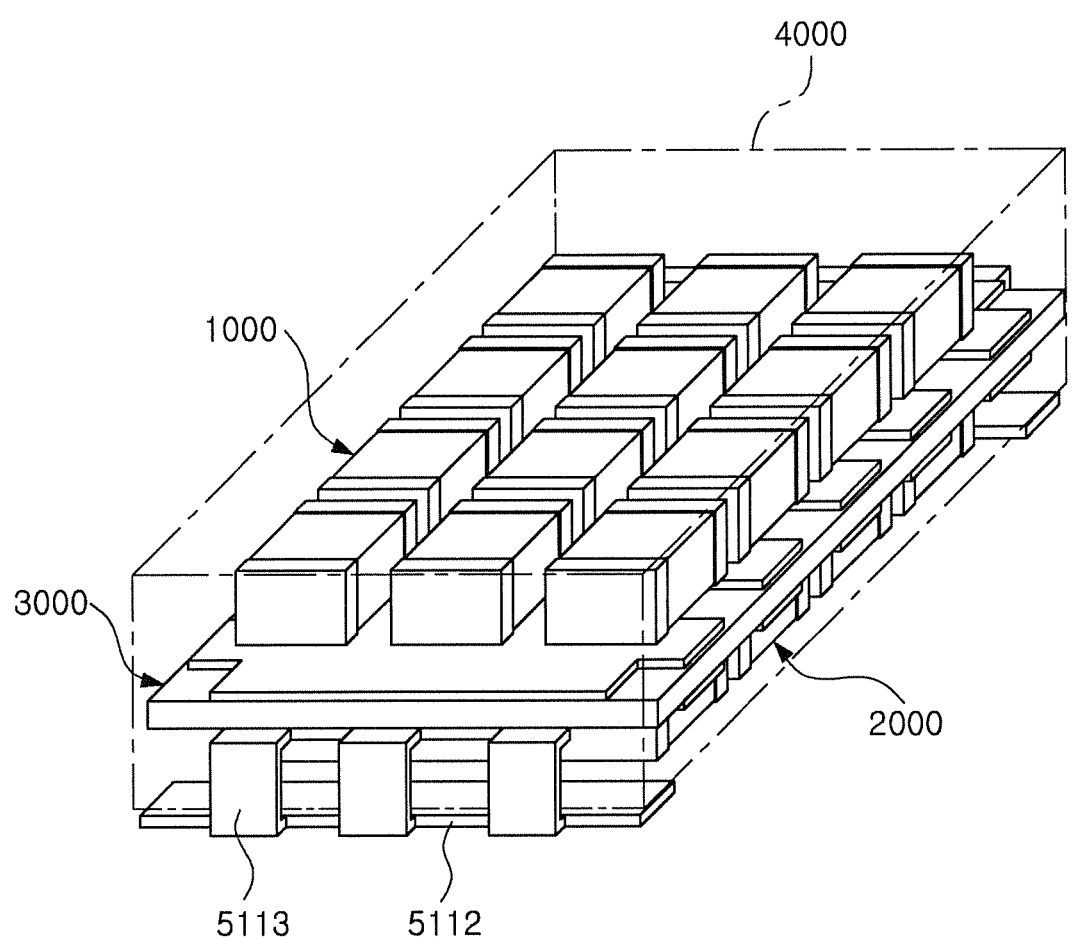
FIG. 11 is a perspective view illustrating a molding part formed to enclose the multilayer ceramic capacitor and the board in FIG. 10.

FIG. 8 is an exploded perspective view schematically illustrating a disposition of a board and a plurality of multilayer ceramic capacitors in a multilayer ceramic component according to another exemplary embodiment in the present disclosure. FIG. 9 is a bottom view of the board in FIG. 8. FIG. 10 is a perspective view schematically illustrating the coupling structure of the board and a terminal frame in the multilayer ceramic component according to another exemplary embodiment in the present disclosure. FIG. 11 is a perspective view illustrating a molding part formed to enclose the multilayer ceramic capacitor and the board in FIG. 10.

Hereinafter, detailed descriptions the same as those of the previous exemplary embodiment will be omitted.

Referring to FIGS. 8 through 11, the multilayer ceramic component according to another exemplary embodiment in the present disclosure may include a board 3000; first and second multilayer ceramic capacitors 1000 and 2000; a molding part 4000; and first and second metal terminals 5100 and 5200.

In the multilayer ceramic component according to the present exemplary embodiment, a plurality of multilayer ceramic capacitors 1000 and 2000 may be connected to each other in series and in parallel, such that withstand voltage and capacitance for the size may be increased.

The board 3000 according to the present exemplary embodiment may include a body 3100, a plurality of first electrode pads 3111, 3113, and 3114 disposed to be spaced apart from each other on an upper surface of the body 3100 in the length direction, and a plurality of second electrode pads 3112, 3115, and 3116 disposed to be spaced apart from each other on a lower surface of the body 3100 in the length direction.

The first multilayer ceramic capacitor 1000 may be disposed so that first and second external electrodes 1310 and 1320 are connected to left and right first electrode pads 3111 and 3113, or 3113 and 3114 adjacent to each other in the length direction, respectively.

The first electrode pads 3111, 3113, and 3114 may be disposed to be spaced apart from each other on the upper surface of the body 3100 in the length direction, and come into mechanical contact with lower surfaces of first and second band portions of first and second external electrodes 1310 and 1320 of each of the first multilayer ceramic capacitors 1000 to be described below, thereby being electrically connected to each of the first multilayer ceramic capacitors 1000.

In this case, if necessary, conductive adhesive layers may be disposed on upper surfaces of the first electrode pads 3111, 3113, and 3114, respectively, such that the first electrode pads 3111, 3113, and 3114 and lower surfaces of first and second band portions of first and second external electrodes 1310 and 1320 of the first multilayer ceramic capacitors 1000 to be described below may be adhered to each other, and adhesive force therebetween may be improved.

The second multilayer ceramic capacitor 2000 may be disposed so that first and second external electrodes 2310 and 2320 are connected to left and right second electrode pads 3112 and 3115, or 3115 and 3116 adjacent to each other in the length direction, respectively.

The second electrode pads 3112, 3115, and 3116 may be disposed to be spaced apart from each other on the lower surface of the body 3100 in the length direction, and disposed to correspond to the first electrode pads 3111, 3113, and 3114 with the body 3100 interposed therebetween.

The second electrode pads 3112, 3115, and 3116 may be disposed to be spaced apart from each other on the lower surface of the body 3100 in the length direction, and come into mechanical contact with upper surfaces of first and second band portions of first and second external electrodes 2310 and 2320 of each of the second multilayer ceramic capacitors 2000 to be described below, thereby being electrically connected to each of the second multilayer ceramic capacitors 2000.

In this case, if necessary, conductive adhesive layers may be disposed on lower surfaces of the second electrode pads 3112, 3115, and 3116, respectively, such that the first electrode pads 3112, 3115, and 3116 and upper surfaces of first and second band portions of first and second external electrodes 2310 and 2320 of the second multilayer ceramic capacitors 2000 to be described below may be adhered to each other, and adhesive force therebetween may be improved.

Meanwhile, a via electrode 3119 may be formed to penetrate through the body 3100 in positions in which the first electrode pads 3111, 3113, and 3114 and the second electrode pads 3112, 3115, and 3116 face each other, such that the first electrode pads 3111, 3113, and 3114 and the second electrode pads 3112, 3115, and 3116 may be electrically connected to each other.

Further, the first electrode pads 3111, 3113, and 3114 and the second electrode pads 3112, 3115, and 3116 may be extended outwardly in the length direction so that spaces for bonding the first and second metal terminals 5110 and 5120 may be sufficiently secured. If necessary, the first electrode pads 3113 and 3114 and the second electrode pads 3115 and 3116 may be extended to be exposed to both end surfaces of the body 3100 in the length direction.

Further, plating layers may be formed on surfaces of the first electrode pads 3111, 3113, and 3114 and the second electrode pads 3112, 3115, and 3116.

The molding parts 4000 may be formed to enclose the board 3000 and the first and second multilayer ceramic capacitors 1000 and 2000.

First ends of the first and second metal terminals 5110 and 5120 may be connected to the second electrode pads 3115 and 3116 disposed on both end portions of the body 3100 of the board 3000 in the length direction, and the other ends thereof may be exposed externally from the molding part 4000 to thereby be connected to external terminals (not illustrated).

The first and second metal terminals 5110 and 5120 may include a first bonding portion 5111 and a second bonding portion (not illustrated) which have first ends connected to the second electrode pads 3115 and 3116 disposed on both ends of the board 3000, in the length direction, respectively, and the other ends exposed to both end surfaces of the molding part 4000 in the length direction, respectively; first and second terminal portions 5112 and 5122 disposed to be spaced apart from each other on the lower surface of the molding part 4000; and first and second connection portions 5113 and 5123 disposed to be spaced apart from each other on both end surfaces of the molding part 4000 in the length direction, respectively, and connecting exposed portions of the first bonding portion 5111 and the second bonding portion (not illustrated) to first ends of the first and second terminal portions 5112 and 5122.

In this case, the first and second connection portions 5113 and 5123 may have one or more grooves 5114 and 5124.

The grooves 5114 and 5124 as described above may decrease volumes of the first and second metal terminals 5110 and 5120 to decrease rigidity, such that elastic deformation may be more easily generated, thereby increasing a vibration blocking effect.

Further, if necessary, adhesive layers may be further disposed on the first bonding portion 5111 and the second bonding portion (not illustrated) of the first and second metal terminals 5110 and 5120 to improve adhesive strength with the second electrode pads 3115 and 3116 disposed on both ends of the board 3100 in the length direction.

As set forth above, according to exemplary embodiments in the present disclosure, the metal terminals may absorb external mechanical stress to prevent the multilayer ceramic capacitors from being damaged and may absorb piezoelectric vibrations of the multilayer ceramic capacitors to suppress the piezoelectric vibrations from being transferred to the board.

In addition, since in the multilayer ceramic component according to exemplary embodiments in the present disclosure, heat generated in the multilayer ceramic capacitors is radiated through the metal terminals and the molding part encloses the multilayer ceramic capacitors, a temperature increase in the multilayer ceramic capacitors may be suppressed, and reliability thereof may be improved.

Further, since in the multilayer ceramic component according to exemplary embodiments in the present disclosure, the capacitors are mounted on upper and lower surfaces of the board to face each other, the component may be miniaturized, and capacitance may be increased.

While exemplary embodiments have been shown and described above, it will be apparent to those skilled in the art that modifications and variations could be made without departing from the scope of the present inventive concept as defined by the appended claims.

What is claimed is:

1. A multilayer ceramic component comprising:
a board including a plurality of electrode pads disposed to be spaced apart from each other in a length direction on opposing surfaces of the board in a thickness direction of the board;
a plurality of first and second multilayer ceramic capacitors disposed on both surfaces of the board in the thickness direction such that external electrodes thereof are connected to electrode pads adjacent to the external electrodes, respectively;
a molding part enclosing the board and the plurality of first and second multilayer ceramic capacitors;
electrode pads disposed spaced apart from each other on the board in the length direction; and
first and second metal terminals, each having a first end connected to an electrode pad and enclosed by the molding part, and a second end exposed to an exterior of the molding part at least partially covering a surface of the molding part opposite the first end,
wherein the first and second metal terminals include:
first and second bonding portions disposed at the first end of a corresponding metal terminal, and having first ends connected to the electrode pads disposed to be spaced apart from each other on the board in the length direction, respectively, and second ends exposed to opposing surfaces of the molding part in a length direction of the molding part, respectively;
first and second terminal portions disposed at the second end of a corresponding metal terminal and spaced apart from each other on the surface of the molding part in a thickness direction of the molding part; and
first and second connection portions disposed on opposing surfaces of the molding part in the length direction, respectively, and connecting the first and second bonding portions to the first and second terminal portions, respectively.

2. The multilayer ceramic component of claim 1, wherein the electrode pads are disposed to face each other with the board interposed between the electrode pads and are electrically connected to each other by a via electrode penetrating through the board.

3. The multilayer ceramic component of claim 1, wherein the first and second connection portions have at least one groove.

4. The multilayer ceramic component of claim 1, wherein at least one of the electrode pads extends to be exposed to an end surface of the board in the length direction.

5. The multilayer ceramic component of claim 1, further comprising plating layers formed on the electrode pads.

6. The multilayer ceramic component of claim 1, wherein the multilayer ceramic capacitors include first and second external electrodes disposed on opposing end portions of a ceramic body in a length direction, respectively,
the first and second external electrodes including first and second connection portions disposed on opposing surfaces of the ceramic body in the length direction, respectively, and first and second band portions extended from the first and second connection portions to portions of at least one surface of the ceramic body in a thickness direction.

7. The multilayer ceramic component of claim 6, wherein the multilayer ceramic capacitor includes a plurality of first and second internal electrodes alternately stacked in the ceramic body with respective dielectric layers interposed between the plurality of first and second internal electrodes to be alternately exposed to opposing surfaces of the ceramic body in the length direction, and connected to the first and second connection portions, respectively.

8. The multilayer ceramic component of claim 6, further comprising conductive adhesive layers disposed between the electrode pads and the first and second band portions, respectively.

9. The multilayer ceramic component of claim 1, wherein conductive adhesive layers are disposed between the electrode pads and the first and second metal terminals, respectively.

10. A multilayer ceramic component, comprising:
a board including a plurality of electrode pads disposed to be spaced apart from each other in a length direction on opposing surfaces of the board in a thickness direction of the board;
a plurality of first and second multilayer ceramic capacitors disposed on both surfaces of the board in the thickness direction such that external electrodes thereof are connected to electrode pads adjacent to the external electrodes, respectively;
a molding part enclosing the board and the plurality of first and second multilayer ceramic capacitors; and
first and second metal terminals having first ends connected to the electrode pads disposed to be spaced apart from each other on the board in the length direction, respectively, and second ends exposed to an exterior of the multilayer ceramic component, wherein the first and second metal terminals include
first and second bonding portions having first ends connected to the electrode pads disposed to be spaced apart from each other on the board in the length direction, respectively, and second ends exposed to opposing surfaces of the molding part in a length direction of the molding part, respectively,
first and second terminal portions disposed to be spaced apart from each other on a surface of the molding part in a thickness direction of the molding part, and
first and second connection portions disposed on opposing surfaces of the molding part in the length direction, respectively, and connecting the first and second bonding portions to the first and second terminal portions, respectively.

11. The multilayer ceramic component of claim 10, wherein the first and second connection portions have at least one groove.

* * * * *